United States Patent
Khullar et al.

(10) Patent No.: US 9,234,938 B2
(45) Date of Patent: Jan. 12, 2016

(54) MONITORING ON-CHIP CLOCK CONTROL DURING INTEGRATED CIRCUIT TESTING

(71) Applicant: STMicroelectronics International N.V., Amsterdam (NL)

(72) Inventors: Shray Khullar, New Delhi (IN); Swapnil Bahl, New Delhi (IN)

(73) Assignee: STMICROELECTRONICS INTERNATIONAL N.V., Amsterdam (NL)

(*) Notice: Subject to any disclaimer, the term of this patent is extended or adjusted under 35 U.S.C. 154(b) by 140 days.

(21) Appl. No.: 14/270,964

(22) Filed: May 6, 2014

(65) Prior Publication Data
US 2015/0323594 A1    Nov. 12, 2015

(51) Int. Cl.
*G01R 31/317* (2006.01)
*G01R 31/3177* (2006.01)
*G01R 31/28* (2006.01)

(52) U.S. Cl.
CPC ...... *G01R 31/31727* (2013.01); *G01R 31/2815* (2013.01); *G01R 31/3177* (2013.01); *G01R 31/31704* (2013.01); *G01R 31/31705* (2013.01)

(58) Field of Classification Search
CPC .......... G01R 31/31727; G01R 31/31705; G01R 31/31704; G01R 31/2815
See application file for complete search history.

(56) References Cited

U.S. PATENT DOCUMENTS

| | | | | |
|---|---|---|---|---|
| 7,290,188 B1* | 10/2007 | Peterson | ......... | G01R 31/31727 714/724 |
| 7,305,598 B1* | 12/2007 | Sanghani | ......... | G01R 31/31727 714/724 |
| 7,536,617 B2* | 5/2009 | Jun | ......... | G06F 1/06 327/116 |
| 8,375,265 B1* | 2/2013 | Venkatasubramanian | ....... | G01R 31/31858 714/727 |
| 2005/0240847 A1* | 10/2005 | Nadeau-Dostie | ............. | G01R 31/31922 714/726 |
| 2005/0276321 A1* | 12/2005 | Konuk | .......... | G01R 31/318541 375/224 |
| 2006/0117230 A1* | 6/2006 | Scipioni | .......... | G01R 31/31937 714/701 |
| 2006/0242449 A1* | 10/2006 | Frederick | ......... | G01R 31/31727 713/600 |
| 2007/0245180 A1* | 10/2007 | Li | ................ | G01R 31/318552 714/718 |
| 2008/0282110 A1* | 11/2008 | Guettaf | ......... | G01R 31/318552 714/30 |
| 2009/0003424 A1* | 1/2009 | Waayers | ......... | G01R 31/31858 375/226 |
| 2009/0187801 A1* | 7/2009 | Pandey | ......... | G01R 31/318558 714/729 |
| 2010/0251045 A1* | 9/2010 | Hapke | ........... | G01R 31/318552 714/724 |
| 2010/0313089 A1* | 12/2010 | Rajski | ........... | G01R 31/318547 714/731 |
| 2012/0124423 A1* | 5/2012 | Chakravadhanula | ........ | G01R 31/31727 714/27 |
| 2012/0166860 A1 | 6/2012 | Khullar et al. | | |
| 2012/0173943 A1* | 7/2012 | Cesari | ........... | G01R 31/318552 714/731 |
| 2014/0002136 A1* | 1/2014 | Greene | .................. | H03K 19/02 326/93 |
| 2014/0208175 A1* | 7/2014 | Kumar | ........... | G01R 31/318536 714/727 |

* cited by examiner

*Primary Examiner* — Joseph D Torres
(74) *Attorney, Agent, or Firm* — Allen, Dyer, Doppelt, Milbrath & Gilchrist, P.A.

(57) ABSTRACT

The On-Chip Clock (OCC) circuit is for testing an integrated circuit having logic blocks connected in scan chains. An OCC controller is configured to receive a plurality of clock signals and output a plurality of shift/capture clock signals for use by the scan chains of logic blocks, the plurality of shift/capture clock signals including at least two consecutive at-speed capture clock pulses. An OCC monitor is configured to provide a verification of OCC operation based upon the at least two consecutive at-speed capture clock pulses. The OCC monitor may include a plurality of registers configured to provide delayed pulses based upon the at least two consecutive at-speed capture clock pulses, a counter configured to count differences between the delayed pulses, and an output register coupled to the counter and configured to provide a static data verification (e.g. output on an integrated circuit pad) for the test engineer.

21 Claims, 2 Drawing Sheets

MONITORING ON-CHIP CLOCK CONTROL DURING INTEGRATED CIRCUIT TESTING

FIELD OF THE INVENTION

The present invention relates to the field of integrated circuits, and, more particularly, to the use of on-chip clock controllers during integrated circuit testing and related methods.

BACKGROUND OF THE INVENTION

Automatic test pattern generation (ATPG) is used to identify test sequences which can be applied to circuits to determine whether they operate correctly. In ATPG, test patterns are generated and used to test semiconductor devices after manufacture. Test patterns may also be used to assist in the determination of the causes of defects.

Effective testing of integrated circuits significantly enhances the ability of integrated circuit developers and manufacturers to provide reliable devices. Various techniques have been employed to test integrated circuits during the manufacturing process. One such technique that is commonly known, and has been used within the industry for over twenty years is scan testing.

Scan testing provides an efficient approach to testing the structural integrity of devices, such as flip-flops, within a complex integrated circuit. Scan testing does not test integrated circuit-level functionality. Rather, test personnel use scan testing to confirm that individual flip-flops within an integrated circuit function properly. The number of flip-flops within an integrated circuit, which is often greater than a million, presents a challenge for testing. Scan testing addresses this challenge through the use of automated test units that provide test vectors to scan paths including thousands of flip-flops within integrated circuits that have been designed to support scan testing.

Typically, complex integrated circuits are designed and implemented as a series of interconnected functional blocks, each of which can be tested independently. Devices, such as flip-flops, within these functional blocks can be designed, such that they can be connected together in a scan path to support scan testing. Flip-flops and other elements within a scan path include, in addition to inputs and outputs used for normal operation, two inputs associated with the scan testing capability. These include a scan input (SI) and a scan enable (SE) input. Flip-flops within a scan path have their output connected to the SI input of a subsequent flip-flop. The first flip-flop within a scan path receives its input from an automated test unit through a test access port on the chip. The last flip-flop within a scan path provides its output to the automated test unit through a test access port. Many scan paths can exist within a single integrated circuit.

While scan testing provides significant benefits, challenges exist related to how to efficiently debug a scan testing failure to identify the source or sources of the failure. Identifying the source of a scan path failure can be quite difficult. A typical integrated circuit can include many scan paths with each scan path including as many as 10,000 flip-flops. Additionally, when doing scan testing tens of external clock sources can exist. These external clock sources are in turn coupled through multiplexers, logic gates and buffers to form complicated clock trees, such that a single scan path can be effected by multiple clock sources with thousands of clock tree elements.

The clock pulses needed during the test mode are different than clock pulses needed during operation mode. The tests are relying on the PLL operating correctly, the OCC operating correctly, and the test logic operating correctly. At-speed transition patterns may use the OCC to generate at-speed capture pulses from the PLL. The OCC is a complex sequential MUX. When transition patterns fail during testing (e.g. at silicon), it is difficult to isolate the cause. The PLL may not be operating correctly, but observing the PLL clock at the input/output pads of the IC, after dividing the clock frequency, may not be possible. If patterns fail with at-speed capture pulses, the slow shift clock can be used for capture, and to verify the OCC operation. If the OCC is not working properly, there is currently no approach to verify this issue.

SUMMARY OF THE INVENTION

An On-Chip Clock (OCC) circuit is for an integrated circuit having logic blocks coupled in scan chains. The OCC circuit includes a clock generator configured to generate a plurality of clock signals. An OCC controller is configured to receive the plurality of clock signals and output a plurality of shift/capture clock signals for use by the scan chains of logic blocks, the plurality of shift/capture clock signals comprising at least two consecutive at-speed capture clock pulses. An OCC monitor is configured to provide a verification of OCC operation based upon the at least two consecutive at-speed capture clock pulses.

The OCC monitor may include a plurality of registers configured to provide delayed pulses based upon the at least two consecutive at-speed capture clock pulses. The OCC monitor may further include a counter configured to count differences between the delayed pulses, and an output register coupled to the counter and configured to capture a static data verification or provide a static data verification output on an integrated circuit pad.

The clock generator may include a phased locked loop (PLL) and a clock shaper, clock divider and clock multiplier connected to the PLL. The clock generator varies the plurality of clock signals by at least one of frequency, waveform shape, phase and pulse duration. The OCC controller may be a programmable clock multiplexer (MUX).

A method aspect is directed to a method of providing an On-Chip Clock (OCC) in an integrated circuit having logic blocks coupled in scan chains. The method includes generating a plurality of clock signals with a clock generator, and receiving the plurality of clock signals at an OCC controller and outputting a plurality of shift/capture clock signals for use by the scan chains of the testing logic blocks. The plurality of shift/capture clock signals include at least two consecutive at-speed capture clock pulses. The method includes monitoring the at least two consecutive at-speed capture clock pulses with an OCC monitor to provide a verification of OCC operation.

Generating the plurality of clock signals with the clock generator includes varying the plurality of clock signals by at least one of frequency, waveform shape, phase and pulse duration. Monitoring may include providing delayed pulses based upon the at least two consecutive at-speed capture clock pulses, counting differences between the delayed pulses and providing a static data verification captured on a register or output on an input/output pad of the integrated circuit based upon the counting.

The present embodiments provide for the verification of the OCC during scan testing.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
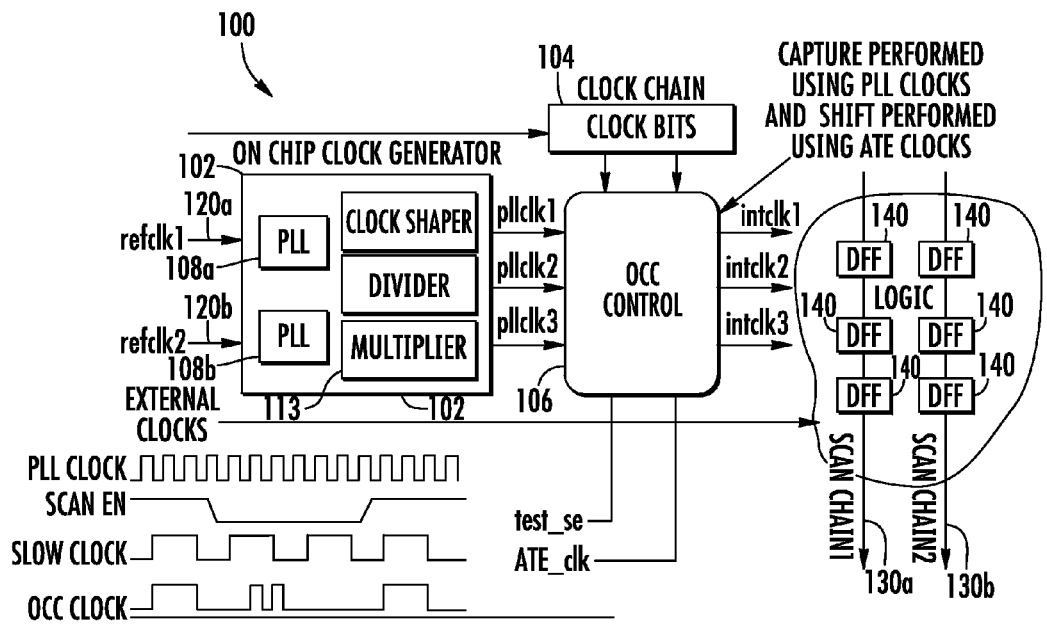
FIG. 1 is a schematic diagram illustrating a known on-chip testing control unit according to the prior art.

Referring initially to FIG. 1, an on-chip testing control unit 100 will be described (e.g. as disclosed in U.S. Patent Publication 2012/0166860 to Khullar et al. and assigned to the present Assignee). Reference clocks 120a, 120b are input into a phase locked loop clock signal generator 102. The phase locked loop clock signal generator 102 includes phase locked loop units 106a, 108b respectively associated with the reference clocks 120a, 120b and a clock shaper 110, a divider 112 and a multiplier 113 for changing the frequency, waveform shape, phase and/or pulse duration, for example. The generator 102 outputs three phase locked loop clocks 122a, 122b, 122c to an OCC controller 106. The OCC controller 106 is controlled using clock control bits output from clock chain control unit 104, a scan enable signal (test_se) 126 and an automatic testing equipment (ATE_clk) clock 128. The OCC controller 106 outputs a plurality of shift/capture clock signals 124a, 124b, 124c to scan chains 130a, 130b of logic blocks 140.

Integrated circuits are designed and implemented as a series of interconnected functional blocks, each of which can be tested independently. Devices, such as flip-flops 140, within these functional blocks can be designed, such that they can be connected together in a scan chain to support scan testing. Flip-flops and other elements within a scan chain include, in addition to inputs and outputs used for normal operation, inputs associated with the scan testing capability. Many scan paths can exist within a single integrated circuit.

ATPG scan methods may comprise different modes. In a shifting mode, indicated by the scan enable signal 126 being asserted or high, the OCC controller is pulsed using the ATE clock signal 128. In a capture mode, indicated by the scan enable signal 126 not being asserted or being low, the OCC controller is pulsed by an individual clock cycle and defects within the logic blocks 140 may be identified.

In the described embodiments, the clock signal may be a phase locked loop clock signal, but the approach may be applicable to other clock signals such as an oscillator signal or any other clock signal. As discussed, in some embodiments, the clock signals may differ in frequency, waveform shape, phase or pulse duration.

Figure 2:
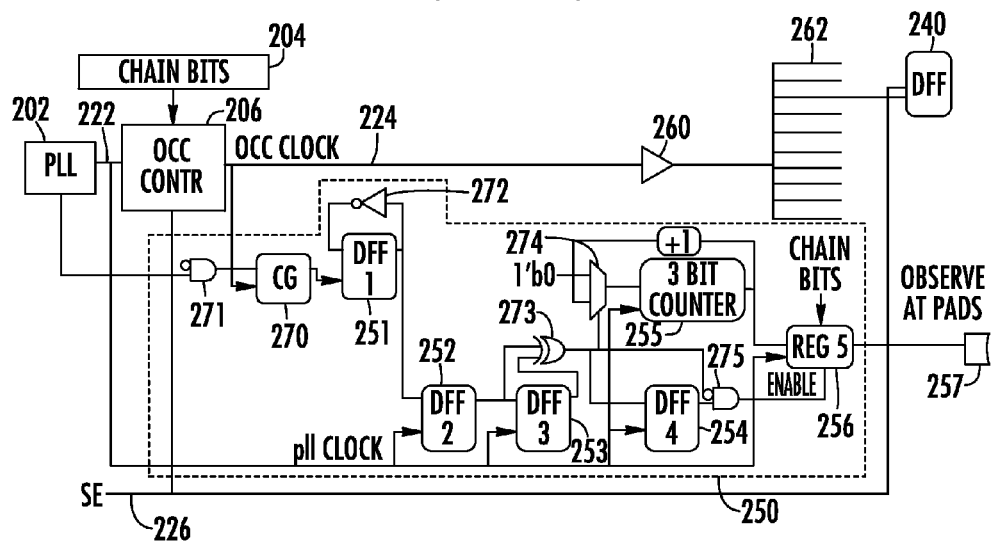
FIG. 2 is a schematic diagram illustrating the OCC circuit including OCC monitor in accordance with features of the present embodiments.
Figure 3:
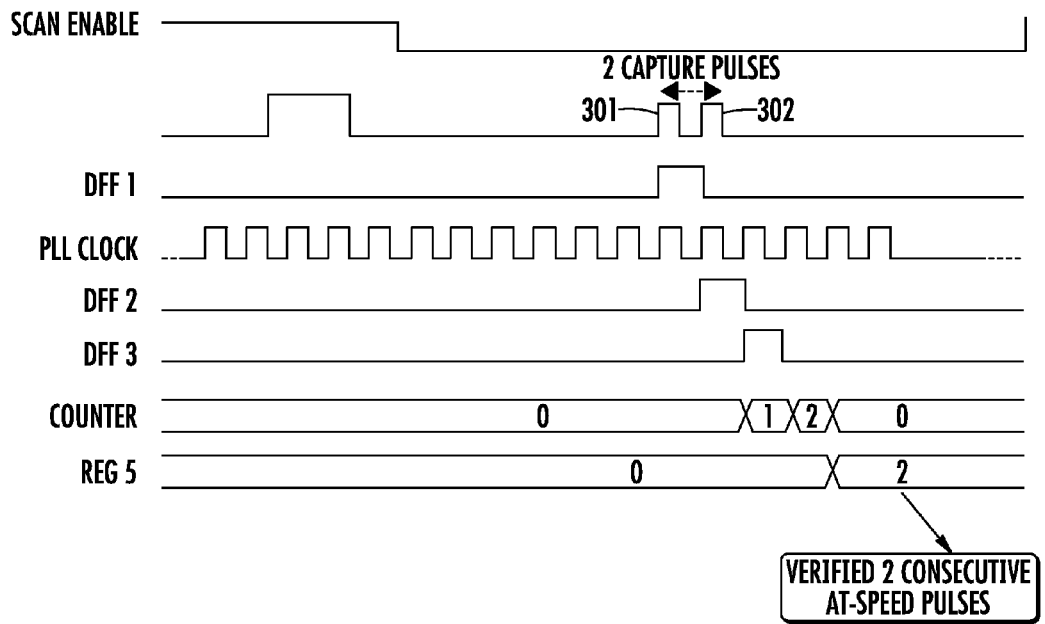
FIG. 3 is a signal timing diagram illustrating the various signals used in the OCC monitoring of the present embodiments.

Referring now additionally to FIGS. 2 and 3, the present approach for the verification of the operation of the On-Chip (OCC) controller during scan testing will now be described.

The On-Chip Clock (OCC) circuit 200 is included in an integrated circuit (IC) that has logic blocks 240 including scan chains 230 as discussed above. The OCC 200 circuit includes a clock generator 202 configured to generate a plurality of clock signals 222. An OCC controller 206, e.g. a programmable clock multiplexer (MUX), is configured to receive the plurality of clock signals 222 and output a plurality of shift/capture clock signals 224 for use by the scan chains 230 of the testing logic blocks 240. The plurality of shift/capture clock signals 224 include at least two consecutive at-speed capture clock pulses, as will be discussed in detail below. An OCC monitor 250 is configured to provide a verification of OCC operation based upon the at least two consecutive at-speed capture clock pulses of the shift/capture clock signals 224.

The OCC monitor 250 may include a plurality of registers 251-254 configured to provide delayed pulses based upon the at least two consecutive at-speed capture clock pulses of the shift/capture clock signals 224. The OCC monitor 250 may further include a counter 255 configured to count differences between the delayed pulses, and an output register 256 coupled to the counter 255 and configured to provide a static data verification output, for example, stored in a register or output on an integrated circuit pad, such as an input/output pad 257.

As discussed above, the clock generator 202 may include a phased locked loop (PLL) and associated clock shaper, clock divider and clock multiplier. The clock generator 202 varies the plurality of clock signals by at least one of frequency, waveform shape, phase and pulse duration.

The OCC controller 206 is controlled using clock control bits output from clock chain control unit 204 and a scan enable signal (test_se) 226. The OCC controller 206 outputs the shift/capture clock signals 224 to clock tree 262 (e.g. via clock divider 260) and the scan chains of logic blocks 240. When the scan enable signal 226 puts the OCC controller 206 in capture mode, the OCC controller 206 is controlled to generate two consecutive at-speed capture clock pulses 301 and 302 (as illustrated in FIG. 3). A clock gate 270 is coupled, via logic gate 271 to receive the clock signal from clock generator 202, and also receive the two consecutive at-speed capture clock pulses 301 and 302 from OCC controller 206.

Register 251, e.g. delayed flip flop (DFF1), receives the output of the clock gate 270 and provides an output, based on the two consecutive at-speed clock pulses 301 and 302, that goes high on the first pulse 301 and low on the second pulse 302, for example (as illustrated in FIG. 3). Register 251 is connected with an associated logic gate 272 (e.g. a NOT gate), as illustrated. Registers 252 and 253 are serially input with the output of register 251. The outputs of the registers 252 and 253 are combined with logic gate 273 (e.g. an XOR gate) resulting in an output that is positive when the inputs are different as illustrated in FIG. 3. Thus, the counter 255, via MUX 274, will increase the count based upon the positive output of logic gate 273. Register 256 is enabled to store the count via logic gate 275. As illustrated in FIG. 3, when the count equals two, the proper operation of the OCC controller 206 may be verified on an input/output pad of the integrated circuit being tested. Also, an internal register may capture the verification data.

Figure 4:
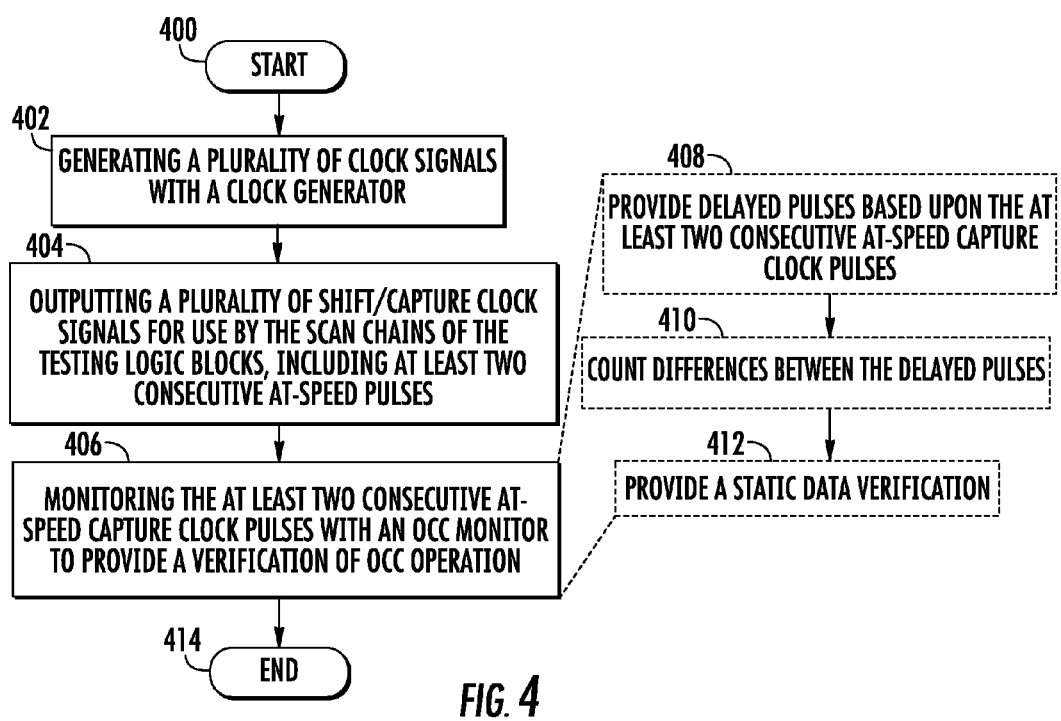
FIG. 4 is flow chart illustrating various steps in a method of monitoring the OCC during scan testing of an integrated circuit in accordance with features of the present embodiments.

A method aspect will be described while referring additionally to the flowchart in FIG. 4. The method is directed to a method of providing an On-Chip Clock (OCC) in an integrated circuit having logic blocks 240 connected in scan chains. The method begins (block 400) and includes generating a plurality of clock signals 222 with a clock generator 202 (block 402), and receiving the plurality of clock signals 222 at an OCC controller 206 and outputting (block 404) a plurality of shift/capture clock signals 224 for use by the scan chains of the logic blocks 240 being tested. The plurality of shift/capture clock signals 224 include at least two consecutive at-speed capture clock pulses 301 and 302. The method includes, at block 406, monitoring the at least two consecutive at-speed capture clock pulses 301 and 302 of the shift/capture clock signals 224 with an OCC monitor 250 to provide a verification of OCC controller operation.

Generating the plurality of clock signals with the clock generator includes varying the plurality of clock signals by at least one of frequency, waveform shape, phase and pulse duration. Monitoring (block 406) may include providing delayed pulses (block 408) based upon the at least two consecutive at-speed capture clock pulses 301 and 302 of the shift/capture clock signals 224 being monitored, counting differences (block 410) between the delayed pulses, and providing (block 412) a static data verification output on an input/output pad of the integrated circuit based upon the counting, before ending at block 414.

As discussed, at-speed transition patterns may use the OCC controller 206 to generate at-speed capture pulses from the PLL. The OCC controller 206 is a complex sequential MUX. When transition patterns fail during testing (e.g. at silicon), it is difficult to isolate the cause. If the OCC controller 206 is operating, or not operating, properly, the approach of the present embodiments, including the OCC monitoring, can be used to verify this issue.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. An On-Chip Clock (OCC) circuit of an integrated circuit having logic blocks coupled in scan chains, the OCC circuit comprising:
   a clock generator configured to generate a plurality of clock signals;
   an OCC controller configured to receive the plurality of clock signals and output a plurality of shift/capture clock signals for use by the scan chains of logic blocks, the plurality of shift/capture clock signals comprising at least two consecutive at-speed capture clock pulses; and
   an OCC monitor configured to provide a verification of OCC operation based upon the at least two consecutive at-speed capture clock pulses.

2. The OCC circuit according to claim 1, wherein the OCC monitor comprises a plurality of registers configured to provide delayed pulses based upon the at least two consecutive at-speed capture clock pulses.

3. The OCC circuit according to claim 2, wherein the OCC monitor further comprises a counter configured to count differences between the delayed pulses.

4. The OCC circuit according to claim 3, wherein the OCC monitor further comprises an output register coupled to the counter and configured to provide a static data verification output on an integrated circuit pad.

5. The OCC circuit according to claim 1, wherein the clock generator comprises a phased locked loop (PLL).

6. The OCC circuit according to claim 5, wherein the clock generator further comprises a clock shaper, clock divider and clock multiplier coupled to the PLL.

7. The OCC circuit according to claim 1, wherein the clock generator varies the plurality of clock signals by at least one of frequency, waveform shape, phase and pulse duration.

8. The OCC circuit according to claim 1, wherein the OCC controller comprises a programmable clock multiplexer (MUX).

9. In integrated circuit comprising:
   a plurality of input/output pads;
   circuit logic blocks coupled in scan chains; and
   an On-Chip Clock (OCC) circuit comprising
      a phased locked loop (PLL) clock generator configured to generate a plurality of clock signals,
      an OCC controller configured to receive the plurality of clock signals and output a plurality of shift/capture clock signals for use by the scan chains of logic blocks, the plurality of shift/capture clock signals comprising at least two consecutive at-speed capture clock pulses, and
      an OCC monitor configured to provide a verification of OCC operation based upon the at least two consecutive at-speed capture clock pulses.

10. The integrated circuit according to claim 9, wherein the PLL clock generator comprises a PLL and a clock shaper, clock divider and clock multiplier coupled to the PLL.

11. The integrated circuit according to claim 9, wherein the PLL clock generator varies the plurality of clock signals by at least one of frequency, waveform shape, phase and pulse duration.

12. The integrated circuit according to claim 9, wherein the OCC controller comprises a programmable clock multiplexer (MUX); and further comprising a clock chain controller configured to provide instructions to the programmable clock MUX regarding the number of shift/capture clock signals needed.

13. The integrated circuit according to claim 9, wherein the OCC monitor comprises:
   a plurality of registers configured to provide delayed pulses based upon the at least two consecutive at-speed capture clock pulses;
   a counter configured to count differences between the delayed pulses; and
   an output register coupled to the counter and configured to provide a static data verification output to at least one input/output pad.

14. A method of providing an On-Chip Clock (OCC) in an integrated circuit having logic blocks coupled in scan chains, the method comprising:
   generating a plurality of clock signals with a clock generator;
   receiving the plurality of clock signals at an OCC controller and outputting a plurality of shift/capture clock signals for use by the scan chains of logic blocks, the plurality of shift/capture clock signals comprising at least two consecutive at-speed capture clock pulses; and
   monitoring the at least two consecutive at-speed capture clock pulses with an OCC monitor to provide a verification of OCC operation.

15. The method according to claim 14, wherein the clock generator comprises a phased locked loop (PLL).

16. The method according to claim 15, wherein the clock generator further comprises a clock shaper, clock divider and clock multiplier coupled to the PLL.

17. The method according to claim 14, wherein generating the plurality of clock signals with the clock generator includes varying the plurality of clock signals by at least one of frequency, waveform shape, phase and pulse duration.

18. The method according to claim 14, wherein the OCC controller comprises a programmable clock multiplexer (MUX).

19. The method according to claim 14, wherein monitoring comprises providing delayed pulses based upon the at least two consecutive at-speed capture clock pulses being monitored.

20. The method according to claim 19, wherein monitoring further comprises counting differences between the delayed pulses.

21. The OCC circuit according to claim 20, wherein monitoring further comprises providing a static data verification output on an input/output pad of the integrated circuit based upon the counting.

* * * * *